(12) United States Patent
Utsunomiya et al.

(10) Patent No.: US 6,359,326 B1
(45) Date of Patent: Mar. 19, 2002

(54) COMPOSITE TRANSISTOR INCORPORATING COLLECTOR-COMMON RESISTORS

(75) Inventors: Satoshi Utsunomiya, Utsunomiya; Nobuo Tomita, Imaichi, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/401,724

(22) Filed: Sep. 23, 1999

(30) Foreign Application Priority Data

Oct. 13, 1998 (JP) .......................................... 10-290425

(51) Int. Cl.[7] .............................................. H01L 29/00
(52) U.S. Cl. ...................................... 257/538; 257/577
(58) Field of Search ................................. 237/538, 537, 237/577

(56) References Cited

U.S. PATENT DOCUMENTS 3,570,114 A * 3/1971 Bean et al. .................. 257/538

FOREIGN PATENT DOCUMENTS

JP 10199988 7/1998

* cited by examiner

Primary Examiner—Sara Crane
(74) Attorney, Agent, or Firm—Stevens, Davis, Miller & Mosher, LLP

(57) ABSTRACT

A semiconductor device requires a reduced cost, has a decreased substrate mounting area, and ensures that paired transistors, etc., have equivalent characteristics to each other. A separation strip 10 splits a semiconductor substrate 3 of one conductivity type into pairing regions and surrounds the semiconductor substrate, and has a high impurity concentration than a front surface side of the semiconductor substrate 3 but the same conductivity type with semiconductor substrate 3. A pair of vertical type semiconductor elements 1, 2 is disposed which shares the semiconductor substrate as a collector region, and the semiconductor elements 1, 2 comprise base regions 12, 22 of a reverse conductivity type which are formed respectively in the pairing regions and emitter regions 13, 23 of the one conductivity type which are formed within the base regions 12, 22 of the reverse conductivity type. At least one pair resistor elements 14, 24 is formed in the pairing regions on an insulation film which covers a surface of the semiconductor substrate 3.

1 Claim, 6 Drawing Sheets

COMPOSITE TRANSISTOR INCORPORATING COLLECTOR-COMMON RESISTORS

BACKGROUND OF THE INVENTION

1. Field of the Invention

The present invention relates to a semiconductor device which comprises at least one pair, i.e., one or more pairs of transistors and resistors, and more particularly, to prevention countermeasures against unevenness of circuit operations due to differences between characteristics and resistance values of transistors.

2. Description of the Background Art

Figure 6:
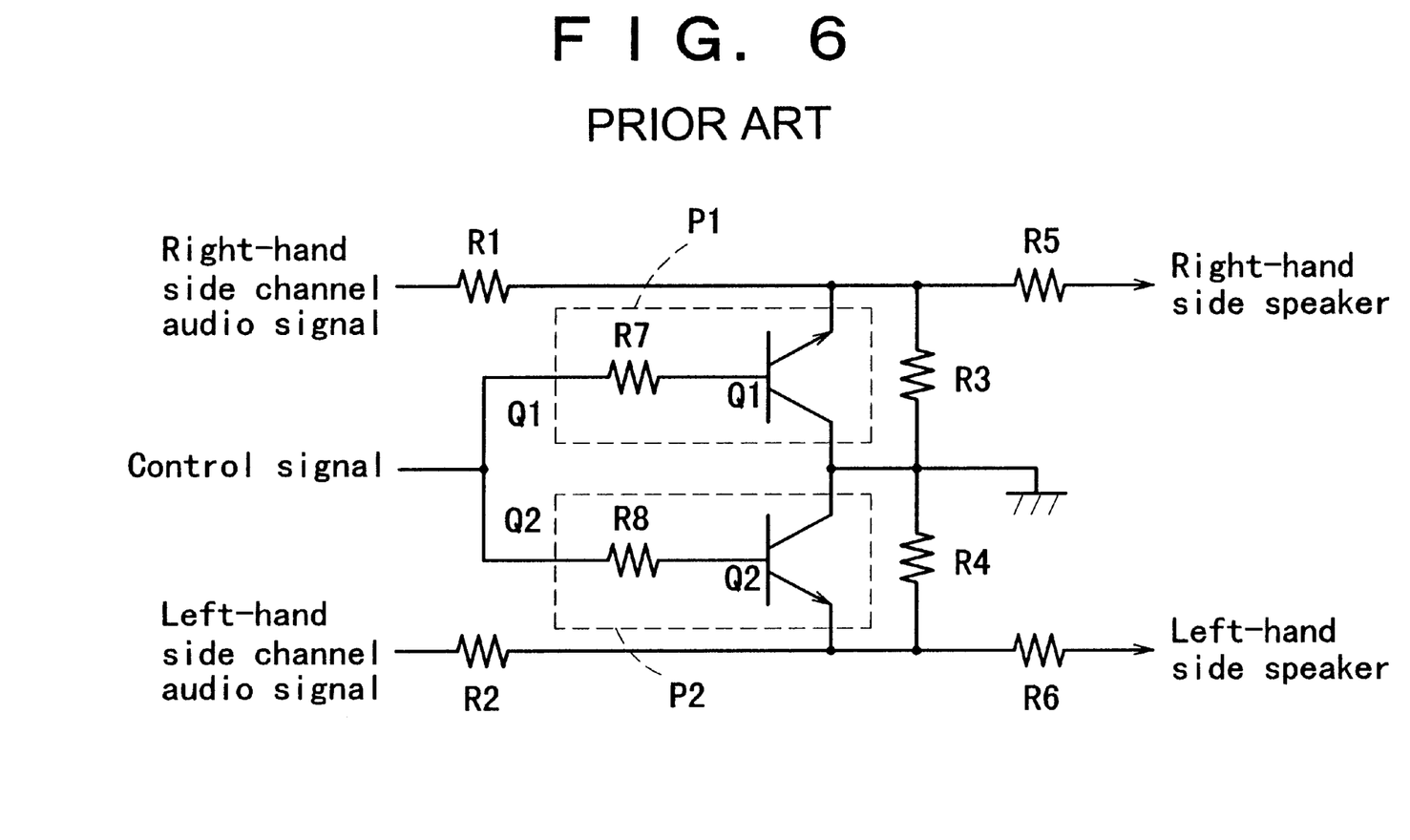
FIG. 6 is a circuitry diagram showing one example of an audio muting circuit which comprises a conventional semiconductor device.

FIG. 6 is a circuitry diagram showing one example of a muting circuit for general audio signals. The circuit comprises resistors R1 through R8, transistors Q1 and Q2 and circuit boards P1 and P2.

As shown in FIG. 6, as a control signal turns on the pair of muting transistors Q1, Q2, a pair of audio signals, one for the right-hand side and the other for the left-hand side, are muted.

While it is a requirement for a pair of speakers, one for the right-hand side and the other for the left-hand side to have equivalent muting characteristics to each other in the muting circuit for audio signals as described above, the two transistors Q1, Q2 incorporating resistors are customarily fabricated separately from each other and individually mounted to the circuit boards P1, P2, respectively.

By the way, in order to mute a pair of the left and the right audio signals by approximately equal attenuation amounts at the same time, characteristics of the transistors Q1, Q2 must match to each other and resistance values of the resistor elements R7, R8 must be approximately equivalent to each other.

However, it is not easy to ensure that the transistors Q1, Q2 which are manufactured separately from each other respectively for the circuit boards P1, P2 have matching characteristics to each other.

Further, it is not easy, either, to ensure that the resistor elements R7, R8 which are disposed separately from each other on an insulation film which covers a surface of semiconductor elements have matching resistance values to each other. To do so leads to an increase in a manufacturing cost, and in addition, to equalize characteristics to a sufficient extent is difficult.

Still further, where two discrete semiconductor elements are used as customarily practiced, since this is an increased number of components, a substrate mounting area and a mounting cost increase.

Accordingly, an objective of the present invention is to provide for a semiconductor device which allows a decrease in a cost, a reduction of a substrate mounting area and equalization of characteristics of a pair of transistors and the like.

SUMMARY OF THE INVENTION

A semiconductor device according to the present invention comprises: a semiconductor substrate of one conductivity type; a separation strip of the one conductivity type which splits the semiconductor substrate into pairing regions and surrounds the semiconductor substrate, the separation strip having a high impurity concentration than a front surface side of the semiconductor substrate; a pair of vertical type semiconductor elements which share the semiconductor substrate as a collector region, the semiconductor elements comprising base regions of a reverse conductivity type which are formed respectively in the pairing regions and emitter regions of the one conductivity type which are formed within the base regions of the reverse conductivity type; an insulation film which covers a surface of the semiconductor substrate; and at least a pair of resistor elements formed in the pairing regions on the insulation film In the semiconductor device according to the present invention, the two vertical type semiconductor elements are formed in a portion of the semiconductor substrate and electrically separated from each other by the separation strip, the insulation film covers the surface of the semiconductor substrate, and the resistor elements are formed on the insulation film. Hence, one semiconductor chip realizes the two semiconductor elements which are electrically separated from each other and which have equivalent characteristics to each other and the plurality of resistor elements. Further, since the semiconductor substrate is shared as the collector region unlike in a conventional semiconductor device, it is possible to reduce a cost and a size.

In addition, in the semiconductor device above, the diffusion depth and the impurity concentration of the separation strip are equivalent to or larger than those of the emitter regions.

Since this realizes a structure in which it is possible to form the semiconductor region of the separation strip utilizing a step of forming a diffusion region of a transistor, a manufacturing cost of the semiconductor device is reduced. Further, since the separation strip is not formed by combination of semiconductor regions of two conductivity types of the P type and the N type but by semiconductor regions of one conductivity type, the separation strip demands a smaller area, which in turn reduces an area needed for the entire semiconductor device and a manufacturing cost. Still further, since the concentration and the depth of the separation strip are equivalent to those of the emitter regions and the separation strip has the same conductivity type as the semiconductor substrate but a higher impurity concentration than the semiconductor substrate, it is possible to prevent mutual interference between the vertical type semiconductor elements at the surface side of the semiconductor elements on the surface of the semiconductor substrate.

Moreover, in the semiconductor device above, an outer periphery of the separation strip is in contact with a scribe line of the reverse conductivity type which surrounds the semiconductor substrate, and a region which corresponds to the scribe line is not formed at a position of a common region of the separation strip at which the vertical type semiconductor elements are opposed with each other through the separation strip.

The reason a lower portion of the common region of the separation strip does not comprise the reverse conductivity type region which exists in the scribe line is to prevent the common region of the separation strip from disconnecting this element which is usually fabricated separately from each other and to decrease the area which the separation strip occupies in the semiconductor substrate so that a compact size is realized.

Further, in the semiconductor device above, a bonding pad which is connected to the emitter regions and the base regions is disposed on the outer periphery side of the separation strip to the common region of the separation strip.

This allows to shorten a wire, for example, which connects to the bonding pad.

Further, in the semiconductor device above, the vertical type semiconductor elements are opposed with each other through the separation strip, and a common wire for connecting the resistor elements to the emitter regions or the base regions is disposed in the vicinity of the common region of the separation strip.

This permits to effectively utilize a space which is created between the separation strip and the bonding pad disposed to the emitter regions and the base regions for the purpose of disposing the common wire, and makes it easy to ensure sufficient lengths of the resistor elements.

Further, in the semiconductor device above, a pair of resistor elements extending in equivalent directions is disposed in the same pairing regions with the pair of vertical type semiconductor elements.

Further, the vertical type semiconductor elements are opposed with each other through the separation strip and symmetric with respect to the common region of the separation strip.

Further, leads which are electrically connected to emitter electrodes and base electrodes of the vertical type semiconductor elements are disposed opposed against each other in both side portions of a mounting portion of a lead which seats the semiconductor substrate.

This makes it possible to shorten the wiring length of the wire which connects the lead and the electrodes.

DESCRIPTION OF THE PREFERRED EMBODIMENTS

Figure 1:
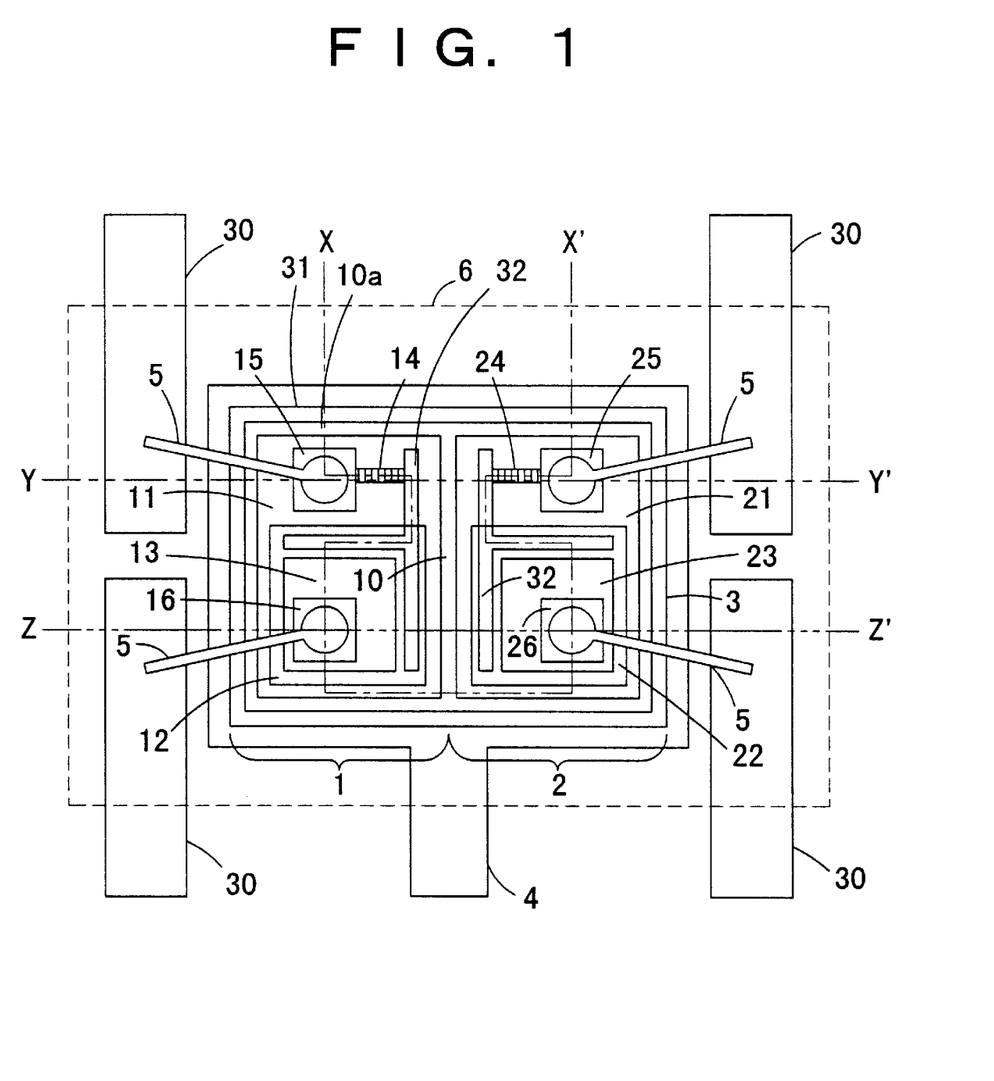
FIG. 1 is a plan view of a semiconductor device according to a preferred embodiment of the present invention in which two vertical type bipolar transistors and two resistors are disposed.
Figure 2:
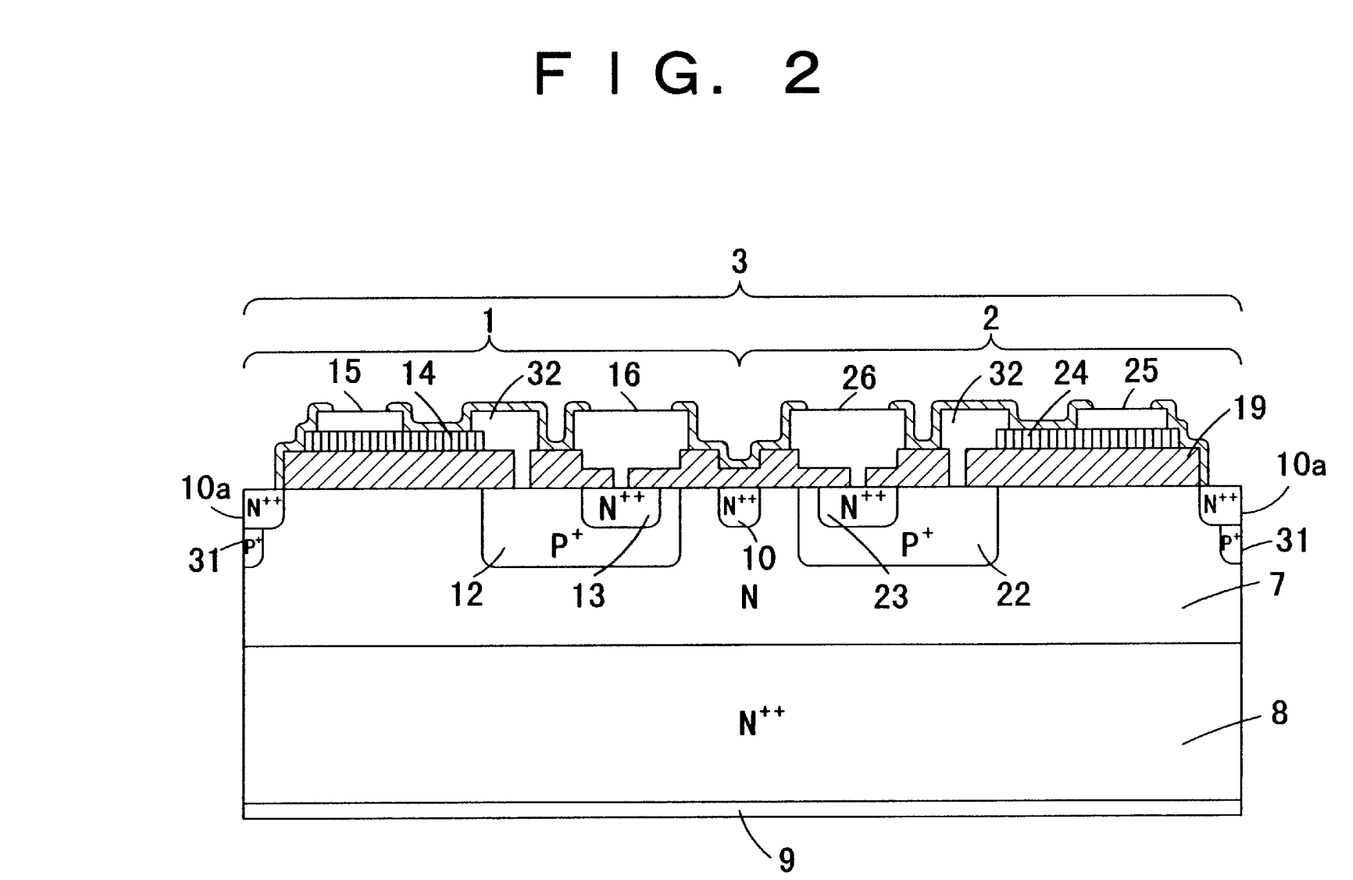
FIG. 2 is a cross sectional structure diagram of a semiconductor substrate of FIG. 1 taken along X–X'.
Figure 3:
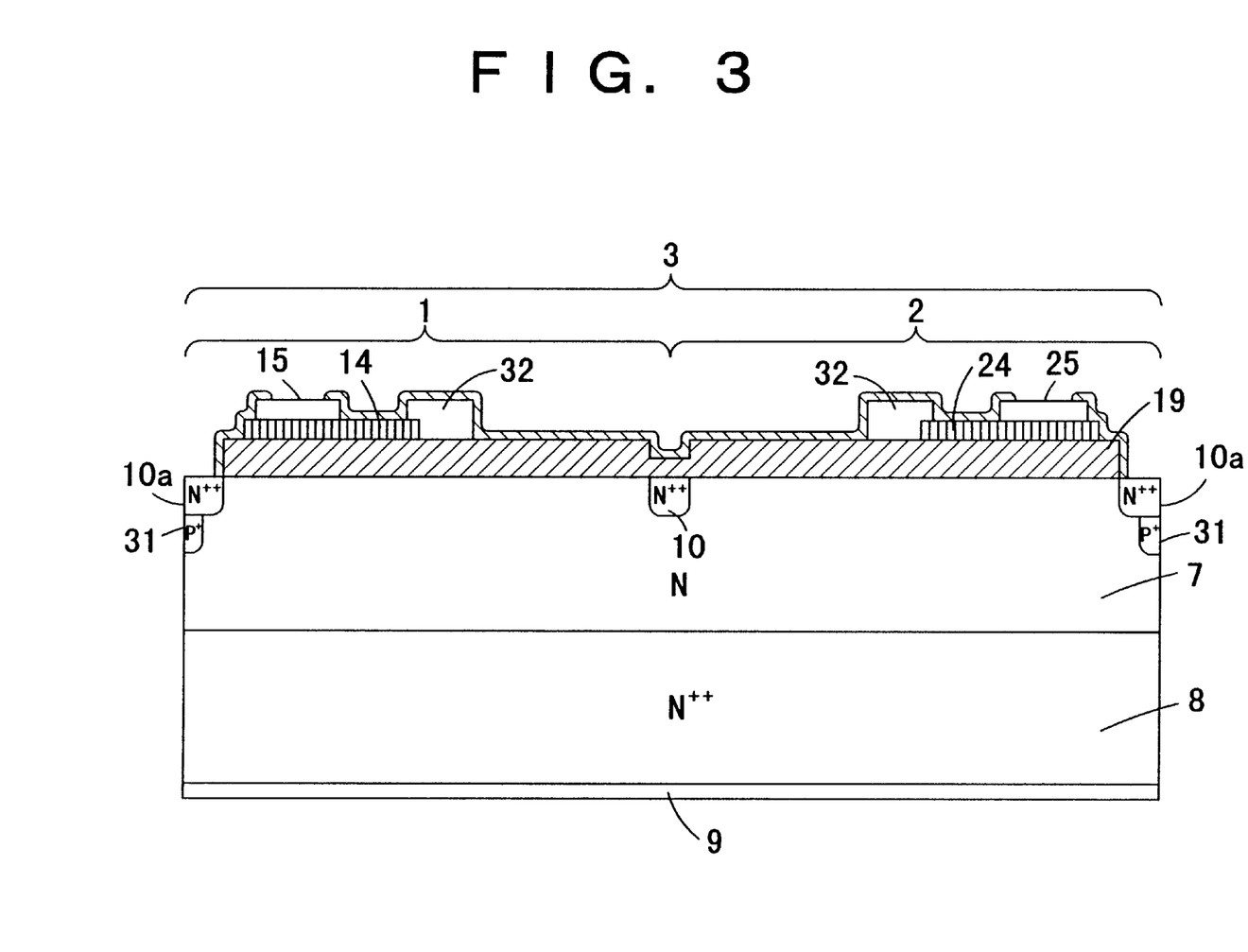
FIG. 3 is a cross sectional view of FIG. 1 taken along Y–Y'.
Figure 4:
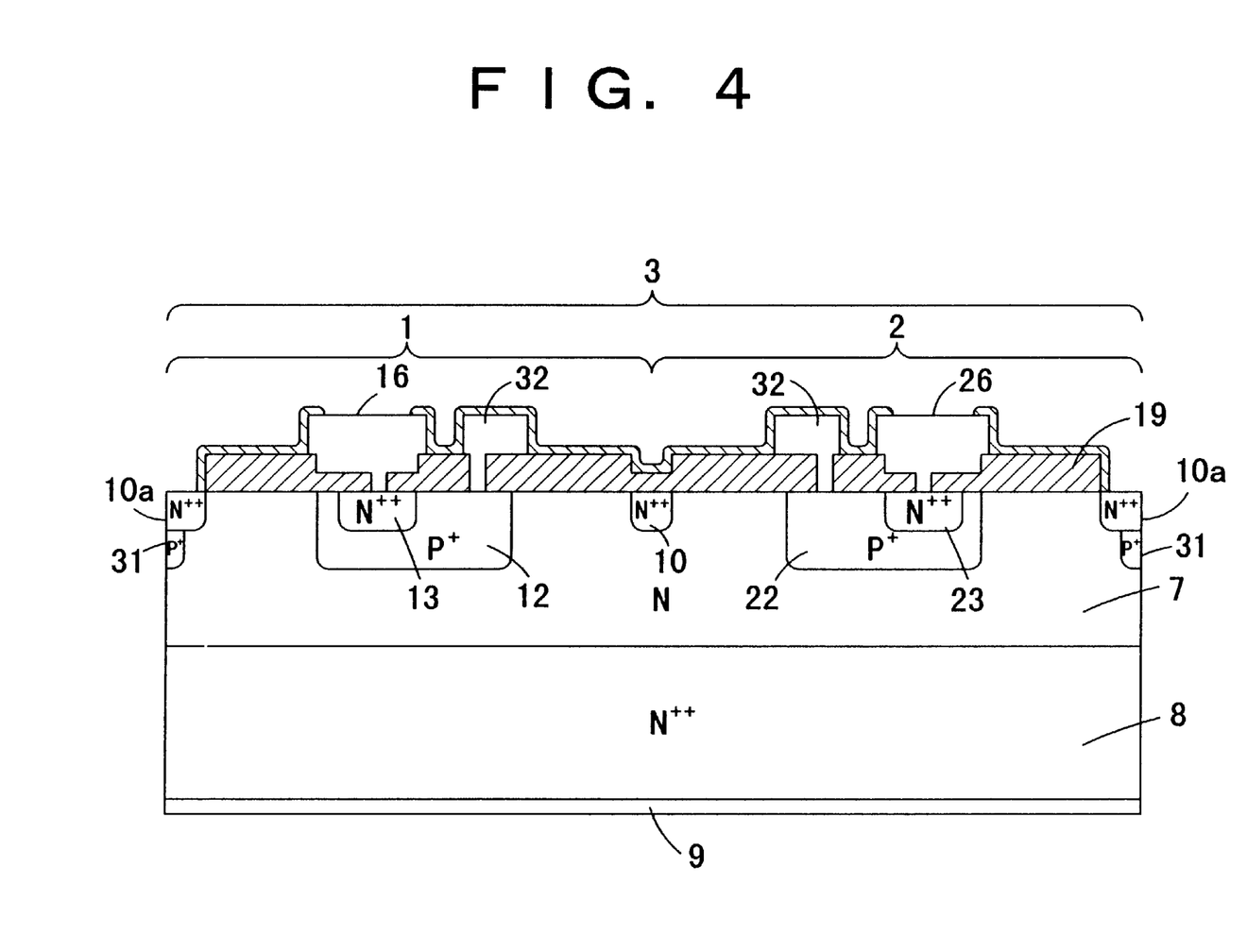
FIG. 4 is a cross sectional view of FIG. 1 taken along Z–Z'.
Figure 5:
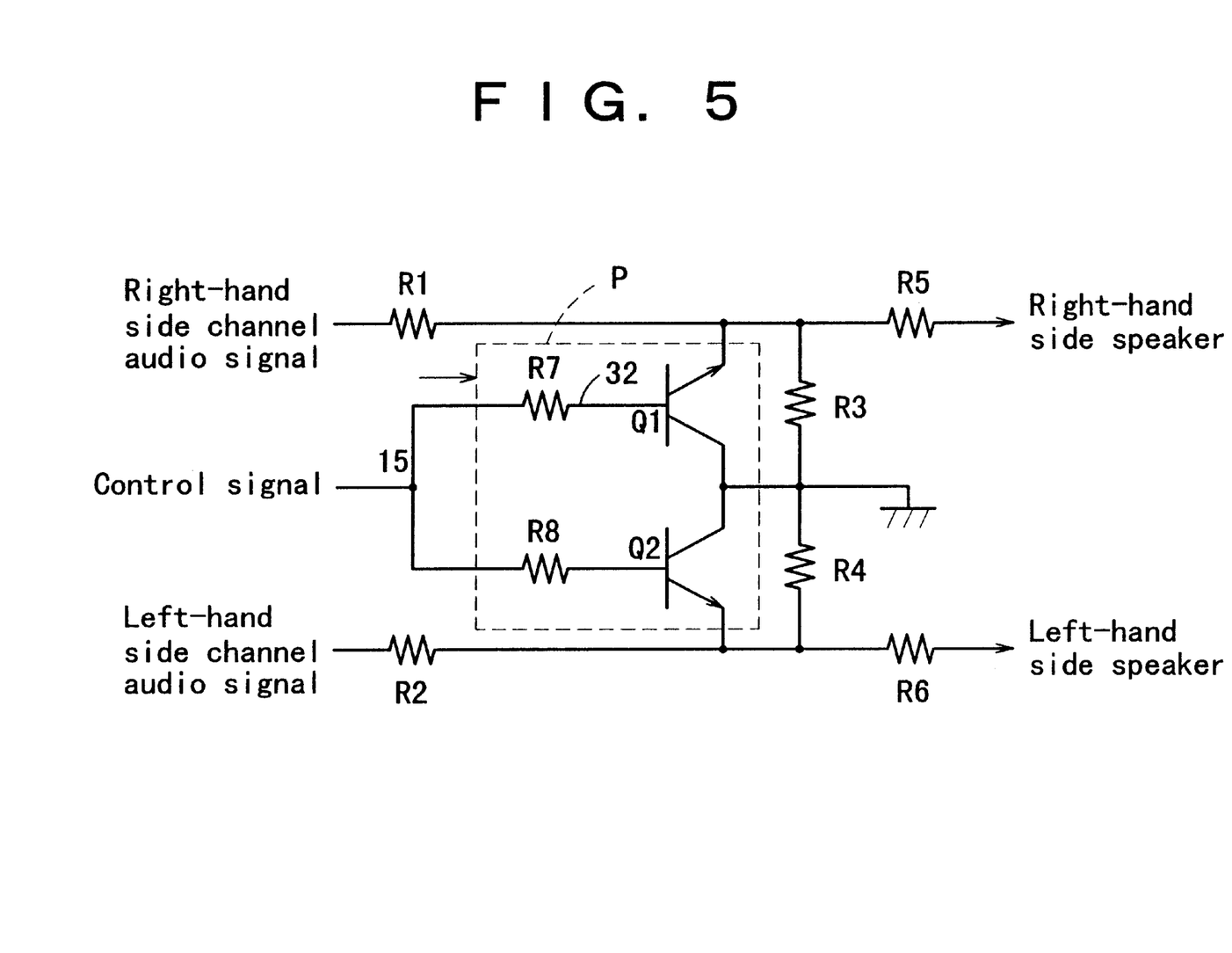
FIG. 5 is a circuitry diagram showing one example of an audio muting circuit which comprises the semiconductor device according to the preferred embodiment.

A preferred embodiment of the present invention will be described with reference to FIGS. 1 through 5. FIG. 1 is a plan view of a semiconductor device according to the preferred embodiment of the present invention, FIG. 2 is a cross sectional structure diagram of a semiconductor substrate 3 (denoted at the dotted-and-dashed line) of FIG. 1 taken along X–X', FIG. 3 is a cross sectional view of FIG. 1 taken along Y–Y' (denoted at the double-dot-and-dash line), FIG. 4 is a cross sectional view of FIG. 1 taken along Z–Z' (denoted at the triple-dot-and-dash line), and FIG. 5 is a circuitry diagram showing one example of an audio muting circuit which comprises the semiconductor device.

The following will describe a case where a pair of, i.e., two vertical type bipolar transistors which share a common collector region and a pair of, i.e., two resistor elements are disposed on a common semiconductor substrate, as the preferred embodiment.

As shown in FIG. 1, the semiconductor device has a plan structure as described below. That is, pairing regions which are separated from each other by a separation strip 10 in the semiconductor substrate 3 seats a pair of vertical type semiconductor elements, namely, two NPN bipolar transistors, one being a first vertical type bipolar transistor 1 and the other being a second vertical type bipolar transistor 2, and also seats a first resistor element 14 and a second resistor element 24 which are disposed as the two resistor elements. The semiconductor substrate 3 has a chip size of 0.85×0.6 mm and a thickness of 200 μm, for example.

The first vertical type bipolar transistor 1 comprises a first emitter region 13 of a first conductivity type, e.g., the N type, a first base region 12 of a second conductivity type, e.g., the P type including the first emitter region 13, a first collector region 11 of the first conductivity type, e.g., the N type including the first base region 12, and the first resistor element 14 which is formed on an insulation film 19.

Meanwhile, the second vertical type bipolar transistor 2 similarly comprises a second emitter region 23 of the N type, a second base region 22 of the P type which includes the second emitter region 23, a second collector region 21 of the N type including the second base region 22, and the second resistor element 24 which is formed on the insulation film 19.

The first and the second base regions 12, 22 of the respective vertical type bipolar transistors 1, 2 are arranged, as viewed in a plan view, symmetric with respect to each other around a center line of the semiconductor device.

Likewise, the first and the second emitter regions 13, 23 are arranged, as viewed in a plan view, symmetric with respect to each other around the center line of the semiconductor device.

The first and the second resistor elements 14, 24 as well are arranged, as viewed in a plan view, symmetric with respect to each other around the center line of the semiconductor device.

Further, the separation strip 10 is disposed along the center line of the semiconductor device and has the same conductivity type, approximately the same impurity concentration and diffusion depth as the both emitter regions 13, 23. However, the separation strip 10 may have a higher impurity concentration and a larger diffusion depth. Although impurities compensating for and exceeding base impurities usually provide a concentration and a depth of an emitter portion, since impurities of the N type are introduced into a region of the same N type as a separation portion, the resulting separation portion naturally has a higher concentration and a larger depth than those of the emitter portion.

Thus, since the concentration and the depth of the separation strip 10 are equivalent to those of the emitter regions 13, 23 and the separation strip 10 has the same conductivity type as that of the semiconductor substrate 3 but a higher impurity concentration than the semiconductor substrate 3, it is possible to prevent mutual interference between the vertical type semiconductor elements at the surface side of the semiconductor elements on the surface of the semiconductor substrate.

The separation strip 10 is formed in a top surface of the semiconductor substrate 3 such that the separation strip 10 traverses the semiconductor substrate 3 linearly along the center line of the semiconductor device from one side surface to an opposing side surface. In short, the separation strip 10 is disposed to split the semiconductor substrate 3 into two in plane. The width of the separation strip 10 is set to be approximately 10–30 μm, for example. Further, in the top surface of the semiconductor substrate 3, semiconductor regions of the separation strip 10 are formed so as to respectively surround outer peripheral portions of the bipolar transistors 1, 2. In this case, according to the preferred embodiment, an outer periphery 10a of the separation strip 10 is in contact with a scribe line 31 of a reverse conductivity type which surrounds the semiconductor substrate 3. A region which corresponds to the scribe line 31 is not disposed at the position of a common region of the separation strip 10 in which the vertical type semiconductor elements are faced with each other through the separation strip 10. The reason for not forming a reverse conductivity type region corresponding to the scribe line in a lower portion of the common region of the separation strip 10 is partly that this is an element which is usually fabricated separately and hence should not be severed apart by the common region of the separation strip 10 and partly for reducing an area size the separation strip 10 occupies in the semiconductor substrate 3 to realize compactness.

Common wires 32 meet one ends of the resistor elements 14, 24. With the vertical type semiconductor elements faced with each other through the separation strip 10, the common wires 32 connect the resistor elements 14, 24 and the base regions 12, 22 in the vicinity of the common region of the separation strip 10.

Further, as shown in FIG. 2 and the like, the semiconductor device has a cross-sectional structure as described below.

A collector electrode 9 made of chromium, silver or the like is disposed on a bottom surface of the semiconductor substrate 3. A bottom most portion of the semiconductor substrate 3 in the vicinity of the collector electrode 9 serves as a common collector contact region 8 of an N⁺ type.

In addition, an N type common collector region 7 is disposed above the common collector contact region 8. Disposed above the common collector region 7 are the separation strip 10, and the first and the second base regions 12, 22 and the first and the second emitter regions 13, 23 of the respective vertical type bipolar transistors 1, 2.

The common collector region 7 serves as the first collector region 11 which is shown in FIG. 1 in the vicinity of the first base region 12, but serves as the second collector region 21 which is shown in FIG. 1 in the vicinity of the second base region 22. Therefore, there is not a boundary between the first collector region 11 and the second collector region 21.

The first and the second collector regions 11, 21 surround the first and the second base regions 12, 22, respectively, within the semiconductor substrate 3, and the first and the second base regions 12, 22 surround the first and the second emitter regions 13, 23, respectively. In other words, the emitter regions 13, 23 are shallower than the base regions 12, 22, respectively.

The first and the second base regions 12, 22 have equivalent depths to each other, and the first and the second emitter regions 13, 23 have equivalent depths to each other.

On the other hand, the insulation film 19 is disposed in the top surface of the semiconductor substrate 3 except for over electrodes and contact portions of the respective regions. The first and the second resistor elements 14, 24 are disposed on the insulation film 19. These paired resistor elements 14, 24 are disposed in the same pairing regions as the pair of vertical type semiconductor elements, extending in equivalent directions.

Further, a first and a second emitter electrodes 16, 26 are formed which contact a first and a second base electrodes 15, 25, which are connected to the first and the second base regions 12, 22 through the resistor elements 14, 24, and the first and the second emitter regions 13, 23.

In this case, the emitter electrodes 16, 26 and the base electrodes 15, 25 are disposed external to the separation strip 10 with respect to the common region of the separation strip 10 as bonding pads, and lead frames 30 which are electrically connected with the emitter electrodes 16, 26 and the base electrodes 15, 25 of the vertical type semiconductor elements are disposed on the both sides of a mounting portion of a lead frame 4 which seats the semiconductor substrate 3 such that the lead frames 30 face with each other.

Now, a method of manufacturing the semiconductor device according to the preferred embodiment will be described.

First, impurities of the N type (such as antimony) are selectively diffused, while simultaneously diffusing boron, in a circular silicon substrate 3 having a diameter of 10 cm (4 inches) in which an epitaxial layer having a specific resistance of 1–10 Ω cm doped with phosphorus or arsenic is formed in a low-resistance silicon substrate which is doped to a high concentration and has a specific resistance of 0.018 Ω cm or lower, thereby simultaneously forming the first base region 12 and the second base region 22 which are independent of each other to equivalent diffusion depths. At this stage, a scribe line 33 of a reverse conductivity type is also formed.

The common collector region 7 has the same impurity concentration as the N type silicon substrate 3 to which phosphorus is added.

Next, phosphorus is introduced partially into the first base region 12 and the second base region 22 which are formed at the precedent step, whereby the first emitter region 13 and the second emitter region 23 which are formed. At this stage, the separation strip 10 is also formed.

Following this, after depositing the insulation film 19 on the substrate 3, a polysilicon film is deposited on the insulation film 19, added with impurities and patterned, whereby the first and the second resistor elements 14, 24 are formed.

Next, a connection hole is formed in the insulation film 19. After further depositing a metal film of an aluminum alloy or the like on the substrate 3, patterning is performed to thereby form the first and the second base electrodes 15, 25 which respectively contact the first and the second base regions 12, 22 and the first and the second emitter electrodes 16, 26 which respectively contact the first and the second emitter regions 13, 23.

After forming a back surface metal layer of chromium, silver or the like in a back surface of the circular silicon substrate 3, each semiconductor device is cut out in an appropriate chip size which comprises the paired two first and second vertical type bipolar transistors 1, 2, the paired two first and second resistor elements 14, 24 which are formed on the insulation film 19 which covers the surface of the silicon substrate 3, and the separation strip 10 which electrically separates the transistors 1, 2 from each other.

After die bonding to the lead frame 4, the first and the second base electrodes 15, 25, the first and the second emitter electrodes 16, 26 and the lead frames are wire-bonded with metal wires 5 of gold or the like.

At last, molding is performed using a resin. As a result of molding using a resin, a resin package 6 is formed in a resin-sealed range which is denoted at the dotted line. At last, after soldering or plating the surfaces of leads, lead forming and cutting is performed.

FIG. 5 shows a muting circuit which corresponds to FIG. 6 as it is transistors Q1, Q2 of the muting circuit and resistors R7, R8 which are connected to bases of the transistors mounted to a common circuit board P. The muting circuit is otherwise similar to the structure shown in FIG. 6.

Having such a structure as described above, the semiconductor device according to the preferred embodiment exhibits the following effects.

First, since the two vertical type bipolar transistors 1, 2 which are required to have equivalent characteristics to each other and the resistor elements 14, 24 are formed as pairs at positions close to each other on the common semiconductor substrate 3 at the same time through the same manufacturing process, unlike two conventional vertical type bipolar transistors which are formed separately from each other, electric characteristics or thermal characteristics of the respective vertical type bipolar transistors 1, 2 are very close to each other.

Hence, it is possible to ensure that a left-hand side channel and a right-hand side channel within the circuit shown in FIG. 5 have approximately the same muting characteristics.

Second, since the separation strip 10 has the same conductivity, approximately the same depth and impurity concentration with the both emitter regions 13, 23, it is possible to form the separation strip 10 utilizing the process of forming the respective vertical type bipolar transistors 1, 2.

Third, since the collector regions 11, 21 of the respective vertical type bipolar transistors 1, 2 are connected to the common collector region 7 in an inner part of the substrate, i.e., the collector regions of the respective transistors are shared, it is possible to share heat which is developed in the respective vertical type bipolar transistors 1, 2, which in turn makes it easy to match thermal characteristics of the transistors 1, 2.

Forth, since the separation strip 10 has a structure which is formed by semiconductor regions of one conductivity type, the separation strip 10 has a narrower width than a separation strip structure of a double conductivity type which combines semiconductor regions of different conductivity types.

In other words, since it is possible to reduce the chip size as much as possible, it is possible to prevent an increased cost of the semiconductor device.

Further, having a plan shape as that shown in FIG. 1, the semiconductor device realizes the following effects.

First, the separation strip 10 which is formed in a central portion of the semiconductor substrate 3 which has a chip-like shape splits the semiconductor substrate 3 and makes the pairing regions surround the semiconductor substrate 3 so that the substrate region in which the respective vertical type bipolar transistors 1, 2 are formed is separated into two regions which are symmetric to each other and the outer peripheral portions of the first and the second base regions 12, 22 are symmetric to each other. This allows that electric characteristics or thermal characteristics of the respective vertical type bipolar transistors are closer to each other.

Second, since the resistor elements 14, 24 are patterned into mutually symmetric shapes, it is possible to eliminate an influence of a dimensional change due to side etching during patterning and obtain the resistor elements 14, 24 whose resistance values are approximately equal to each other.

Third, since the respective vertical type bipolar transistors 1, 2 and the resistor elements 14, 24 are symmetric with respect to each other because of the separation strip 10 which is formed in a central portion of the semiconductor substrate 3, the distance between the transistor 1 and the resistor element 14 and the distance between the transistor 2 and the resistor element 24 are equal. This allows temperature increases in the resistor elements 14, 24 due to heat generation by the transistors 1, 2 to be the same with each other and eliminates a difference between the resistance values of the respective resistor elements 14, 24 because of resistance temperature characteristics of resistors.

Fourth, since the metal electrodes 15, 25 for wire bonding of the respective semiconductor elements 14, 24 are arranged to be symmetric in plane with respect to each other about the separation strip 10, it is possible to connect the lead frames 30 which is formed in a symmetric shape to the elements 14, 24 with metal wires which have approximately the same lengths, and therefore, it is possible to realize electric connection from an external circuit to the two semiconductor elements 14, 24 with approximately the same impedances.

Although the foregoing has described the preferred embodiment in relation to an example which uses one pair of resistor elements, namely the two resistor elements 14, 24, the present invention of course is applicable to where resistor elements are connected also between the bases and the emitters so that two pairs of four resistor elements are used.

Further, the preferred embodiment realizes the following effects. That is, the separation strip 10 is formed continuously from one side surface to other side surface of the semiconductor substrate 3 at least in an area in the vicinity of the top surface of the semiconductor substrate 3. Since this reduces a leak through a side surface of the semiconductor substrate 3, separation characteristics of the respective semiconductor elements 1, 2 or breakdown voltage characteristics of the semiconductor elements improve.

The semiconductor elements 1, 2 are vertical type bipolar transistors which comprise the emitter regions 13, 23 of the first conductivity type which are formed on the semiconductor substrate 3 on the both sides, the base regions 12, 22 of the second conductivity type which are formed to surround the emitter regions 13, 23 within the semiconductor substrate 3, and the collector regions 11, 21 of the first conductivity type which are formed to surround the base regions 12, 22 within the semiconductor substrate 3, while the separation strip 10 is disposed between the collector regions 11, 21 of the respective semiconductor elements 1, 2 so that lateral distances to the respective base regions of the respective semiconductor elements 1, 2 which are faced with the respective semiconductor regions are approximately equal to each other. Because of this, separation characteristics or breakdown voltage characteristics of the semiconductor elements are approximately equivalent to each other.

The separation strip 10 surrounds the respective semiconductor elements 1, 2 at least in an area in the vicinity of the top surface of the semiconductor substrate 3. This allows the separation strip 10 to function as a channel stopper for the semiconductor elements as well.

The semiconductor elements 1, 2 are vertical type bipolar transistors which comprise the emitter regions 13, 23 of the first conductivity type which are formed on the semiconductor substrate 3 on the both sides, the base regions 12, 22 of the second conductivity type which are formed to surround the emitter regions 13, 23 within the semiconductor substrate 3, and the collector regions 11, 21 of the first conductivity type which are formed to surround the base regions 12, 22 within the semiconductor substrate 3, and the collector regions 11, 21 of the semiconductor elements 1, 2 are shared below the separation strip 10. Since this permits the respective semiconductor elements 1, 2 to have approximately the same temperatures, it is possible to reduce a difference in operational characteristics between the two semiconductor elements due to a temperature difference.

The base regions 12, 22 of the respective semiconductor elements 1, 2 are formed to be symmetric in plane with respect to each other about the separation strip 10, while the emitter regions 13, 23 of the respective semiconductor elements 1, 2 are formed to be symmetric in plane with respect to each other about the separation strip 10. Hence, it is possible to ensure that breakdown voltage characteristics, collector saturation voltages and current amplification ratios of the respective semiconductor elements are approximately equivalent to each other.

The respective resistor elements 14, 24 formed on the insulation film 19 are formed to be symmetric in plane with respect to each other about the separation strip 10. Since this allows that resistance values of the resistor elements 14, 24 are approximately equal to each other, it is possible to mute the pair of the left and the right audio signals at approximately equal attenuation amounts.

The semiconductor device is a resin-molded type semiconductor device, with the metal electrodes for wire bonding of the respective semiconductor elements formed to be symmetric in plane with respect to each other about the separation strip. Since this realizes electric connection from an external circuit to the two semiconductor elements in approximately the same wiring lengths and with approximately the same impedances, the purpose of the present invention, that is, simultaneous muting of the pair of the left and the right audio signals by approximately equal attenuation amounts without almost no phase difference, is achieved.

The shape of the lead frame is symmetric with respect to each other about the separation strip 10 of the semiconductor elements 1, 2. Since this realizes electric connection from an external circuit to the two semiconductor elements in approximately the same wiring lengths and with approximately the same impedances, it is possible to mute the pair of the left and the right audio signals simultaneously by approximately equal attenuation amounts without almost no phase difference.

The shapes of wiring (metal wires 5) between the electrode 15 of the respective semiconductor elements 1, 2 and the lead frames 30 are symmetric with respect to the separation strip. Since this realizes electric connection from an external circuit to the two semiconductor elements in approximately the same wiring lengths and with approximately the same impedances, the purpose of the present invention, that is, simultaneous muting of the pair of the left and the right audio signals by approximately equal attenuation amounts without almost no phase difference, is achieved.

As described above, according to the preferred embodiment, the separation strip structure which is formed by the semiconductor region of the first conductivity type is used as a separation structure for semiconductor devices which each comprise the two transistors 1, 2 and the two resistor elements 14, 24 on the common the semiconductor substrate 3, and therefore, the respective semiconductor elements (1, 2) are operable independently of each other without interference which is exerted by signals of each other in each semiconductor device.

Further, as the semiconductor regions of the separation strip 10 have the same impurity concentration and diffusion depth with the emitter regions of the first conductivity type, it is possible to form the separation strip 10 without any additional diffusion step.

Further, since the resistance values which determine muting amounts for use in a muting circuit are equal to each other, it is possible to mute audio signals of two channels, one on the right-hand side and the other on the left-hand side.

Further, since connection from an external circuit to the respective transistors 1, 2 is realized with the lead frame 4 and the metal wires 5 which have the same length, it is possible to prevent signals passing through the two transistors 1, 2 from creating a phase difference, and hence, to reduce a distortion of the signals as they are after muted.

What is claimed is:

1. A semiconductor device, comprising:

a semiconductor substrate of one conductivity type;

a separation strip of the one conductivity type which splits said semiconductor substrate into pairing regions and surrounds said semiconductor substrate, said separation strip having a higher impurity concentration than a front surface side of said semiconductor substrate;

a pair of vertical type semiconductor elements which share said semiconductor substrate as a collector region, said semiconductor elements comprising base regions of a reverse conductivity type which are formed respectively in said pairing regions and emitter regions of the one conductivity type which are formed within said base regions of the reverse conductivity type;

an insulation film which covers a surface of said semiconductor substrate; and at least a pair of resistor elements formed in said pairing regions on said insulation film, wherein a diffusion depth and an impurity concentration of said separation strip are equivalent to or larger than those of said emitter regions and said vertical type semiconductor elements are opposed with each other through said separation strip, and a common wire for connecting said resistor elements to said emitter regions or said base regions is disposed in the vicinity of said common region of said separation strip.

* * * * *